United States Patent
Amano et al.

(10) Patent No.: US 7,998,552 B2
(45) Date of Patent: Aug. 16, 2011

(54) DICING/DIE BONDING FILM

(75) Inventors: Yasuhiro Amano, Ibaraki (JP); Sadahito Misumi, Ibaraki (JP); Takeshi Matsumura, Ibaraki (JP)

(73) Assignee: Nittok Denko Corporation, Osaka (JP)

( * ) Notice: Subject to any disclaimer, the term of this patent is extended or adjusted under 35 U.S.C. 154(b) by 0 days.

(21) Appl. No.: 12/529,070

(22) PCT Filed: Jan. 28, 2008

(86) PCT No.: PCT/JP2008/051177
§ 371 (c)(1),
(2), (4) Date: Aug. 28, 2009

(87) PCT Pub. No.: WO2008/108119
PCT Pub. Date: Sep. 12, 2008

(65) Prior Publication Data
US 2010/0093154 A1 Apr. 15, 2010

(30) Foreign Application Priority Data
Mar. 1, 2007 (JP) .................................. 2007-051805

(51) Int. Cl.
*H01L 21/301* (2006.01)
*H01L 21/52* (2006.01)

(52) U.S. Cl. ......... 428/141; 257/E21.599; 257/E21.214; 438/464

(58) Field of Classification Search .................. 438/464; 428/141; 257/E21.214, E21.599
See application file for complete search history.

(56) References Cited

U.S. PATENT DOCUMENTS

| 4,961,804 A | 10/1990 | Aurichio |
| 2004/0241910 A1 | 12/2004 | Matsumura et al. |
| 2005/0046042 A1 | 3/2005 | Matsumura et al. |
| 2005/0158557 A1 | 7/2005 | Noro |
| 2006/0148131 A1 | 7/2006 | Matsumura et al. |
| 2007/0137782 A1 | 6/2007 | Matsumura et al. |
| 2010/0093154 A1 | 4/2010 | Amano et al. |

FOREIGN PATENT DOCUMENTS

| JP | 55-111151 | 8/1980 |
| JP | 60-057642 | 4/1985 |

(Continued)

OTHER PUBLICATIONS

Machine translation of JP 2006-114586.*

(Continued)

*Primary Examiner* — Matthew Smith
*Assistant Examiner* — Walter H Swanson
(74) *Attorney, Agent, or Firm* — Knobbe Martens Olson & Bear LLP

(57) ABSTRACT

A dicing die-bonding film in which the adhesive properties during the dicing step and the peeling properties during the pickup step are controlled so that both become good, and a production method thereof, are provided. The dicing die-bonding film in the present invention is a dicing die-bonding film having a pressure-sensitive adhesive layer on a base material and a die bond layer on the pressure-sensitive adhesive layer, in which the arithmetic mean roughness X (μm) on the pressure-sensitive adhesive layer side in the die bond layer is 0.015 μm to 1 μm, the arithmetic mean roughness Y (μm) on the die bond layer side in the pressure-sensitive adhesive layer is 0.03 μm to 1 μm, and the absolute value of the difference of the X and Y is 0.015 or more.

11 Claims, 1 Drawing Sheet

FOREIGN PATENT DOCUMENTS

| | | |
|---|---|---|
| JP | 2-248064 | 10/1990 |
| JP | 2000-104040 | 4/2000 |
| JP | 2002-179769 | 6/2002 |
| JP | 2002-256238 | 9/2002 |
| JP | 2002-256239 | 9/2002 |
| JP | 2002-261233 | 9/2002 |
| JP | 2003-119439 | 4/2003 |
| JP | 2004-134689 | 4/2004 |
| JP | 2004-356412 | 12/2004 |
| JP | 2005-166773 | 6/2005 |
| JP | 2005-206665 | 8/2005 |
| JP | 2005-336428 | 12/2005 |
| JP | 2006-114586 | 4/2006 |
| JP | 2006-186305 | 7/2006 |
| JP | 2006-339236 | 12/2006 |
| JP | 2008-124295 | 5/2008 |
| JP | 2008-135448 | 6/2008 |
| JP | 2008-218571 | 9/2008 |
| KR | 2008-0053038 | 6/2008 |
| WO | WO 2004/065510 | 8/2004 |
| WO | WO 2008/108119 | 9/2008 |

OTHER PUBLICATIONS

Machine Translation of JP 2005-166773.*
Machine Translation of JP 2002-256238.*
File History of the related U.S. Appl. No. 12/744,113, as of Jul. 1, 2010.
International Search Report issued on the corresponding PCT Application No. PCT/JP2008/051177, dated Apr. 8, 2008.
Korean Office Action issued in the corresponding Korean Patent Application No. 10-2009-7017947, dated Sep. 13, 2010.

* cited by examiner

[Fig. 1]
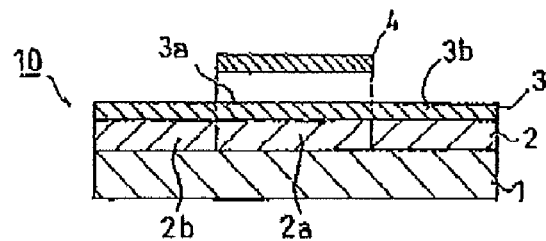
[Fig. 2]
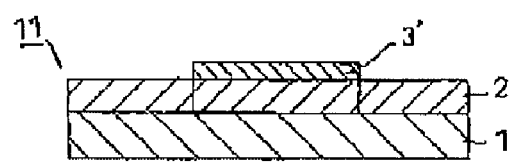
[Fig. 3]
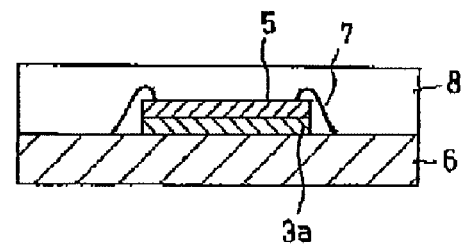
[Fig. 4]
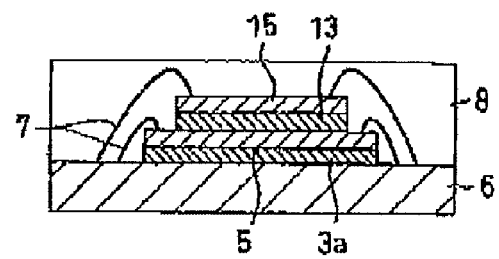
[Fig. 5]
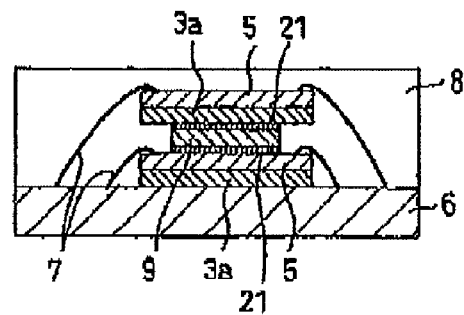

DICING/DIE BONDING FILM

TECHNICAL FIELD

The present invention relates to a dicing die-bonding film and a production method thereof, and in detail relates a dicing die-bonding film that is used in the manufacture of a semiconductor device and a production method thereof.

BACKGROUND ART

In order to meet the request that semiconductor devices are made finer and caused to have higher functions, the wiring width of power supply lines arranged in the entire area of the main faces of their semiconductor chips (semiconductor elements) or the interval between signal lines arranged therein has been becoming narrower. For this reason, the impedance thereof increases or signals between signal lines of different nodes interfere with each other so as to cause hindrance to the exhibition of sufficient performances for the operation speed of the semiconductor chips, the margin of the operating voltage thereof, the resistance thereof against damage by electrostatic discharge, and others. In order to solve these problems, for example, in Patent Document 1 and Patent Document 2, package structures wherein semiconductor elements are laminated are suggested.

As a material used to stick semiconductor elements to a substrate or the like, the following examples are suggested: an example wherein a thermosetting paste resin is used (see, for example, Patent Document 3); and examples wherein en adhesive sheet composed of a thermoplastic resin and a thermosetting resin is used (see, for example, Patent Document 4 and Patent Document 5).

In conventional processes for producing a semiconductor device, an adhesive sheet or an adhesive is used to cause a semiconductor element to adhere onto a substrate, a lead frame or a semiconductor element. The adhesion is attained by attaching the semiconductor element to the substrate or the like under pressure (die attachment), and then curing the adhesive sheet or the like through a heating step.

Here, a wire bonding step is performed to electrically connect a semiconductor element that has been compression-bonded onto a substrate, etc. to the substrate, etc. After that, sealing with a sealing resin is performed by molding the semiconductor element, etc. with the sealing resin, and then curing (for example, refer to the following Patent Documents 4 and 5). When performing the above-described wire bonding, the semiconductor element on the substrate, etc. moves due to ultrasonic vibration and heat.

Therefore, conventionally, there has been a necessity to perform a heating step before the wire bonding to cure a heat curable paste resin or a heat curable adhesive sheet by heat so that the semiconductor element does not move.

About an adhesive sheet made of a thermosetting resin, or an adhesive sheet made of both of a thermosetting resin and a thermoplastic resin, a heating step is further required to keep the adhering strength certainly between the sheet and an adherend and to improve the wettability therebetween after the sheet undergoes die attachment and before the sheet undergoes wire bonding.

Patent Document 1: Japanese Patent Application Laid-Open No. 55-111151
Patent Document 2: Japanese Patent Application Laid-Open No. 2002-261233
Patent Document 3: Japanese Patent Application Laid-Open No. 2002-179769
Patent Document 4: Japanese Patent Application Laid-Open No. 2000-104040
Patent Document 5: Japanese Patent Application Laid-Open No. 2002-261233

DISCLOSURE OF THE INVENTION

Problems to be Solved by the Invention

However, as a semiconductor wafer becomes larger and thinner, it is difficult to satisfy the high adhesive properties that are necessary during dicing and the peeling properties that are necessary during pickup at the same time, and it has been difficult to peel the semiconductor chip with an adhesive from a dicing tape. As a result, there is a problem of damage by pickup failure or deformation of a chip.

Further, an ultraviolet curing-type dicing tape may be equipped depending on the type of dicing die-bonding film. In the case of this ultraviolet curing-type dicing tape, the adhesive force may increase with time by reacting with an uncured resin in the pressure-sensitive adhesive layer. In this case, it becomes difficult to pick up the semiconductor chip with an adhesive from the dicing tape, and the semiconductor chip with an adhesive is disposed without being able to be peeled and removed. As a result, the production cost increases and a decrease of the yield is brought about.

The present invention was performed in view of the above-described problems, and its objective is to provide a dicing die-bonding film in which the adhesive properties during the dicing step and the peeling properties during the pickup step are controlled so that both become good, as well as to provide a production method thereof.

Means for Solving the Problems

The present inventors studied on a dicing die-bonding film and a production method thereof to solve the above-described conventional problems. As a result, they found that both of the adhesive properties during the dicing step and the peeling properties during the pickup step can be made to be good by controlling the adhesion area between the pressure-sensitive adhesive layer and the die bond layer, and came to reached the completion of the present invention That is, the present invention relates to a dicing die-bonding film having a pressure-sensitive adhesive layer on a base material and a die bond layer on the pressure-sensitive adhesive layer, wherein the arithmetic mean roughness X (μm) on the pressure-sensitive adhesive layer side in the die bond layer is 0.015 μm to 1 μm, the arithmetic mean roughness Y (μm) on the die bond layer side in the pressure-sensitive adhesive layer is 0.03 μm to 1 μm, and the absolute value of the difference of the X and Y is 0.015 or more.

With the above-described configuration, without completely adhering the adhesion surface of the pressure-sensitive adhesive layer and the die bond layer, a region where both layers are adhered and a region where they are not adhered are formed. As a result, decrease the adhesive properties between the pressure-sensitive adhesive layer and the die bond layer due to the adhesion area becoming too small is prevented, On the other hand, decrease of the peeling properties of the pressure-sensitive adhesive layer and the die bond layer due to the adhesion area becoming too large is also prevented. Thereby, because the adhesive properties between the pressure-sensitive adhesive layer and the die bond layer is sufficient even when adhering the semiconductor wafer onto the die bond layer and dicing this to form the semiconductor chip for example, so-called chip fly can be prevented from occur-ring. Further, because the peeling properties between the pressure-sensitive adhesive layer and the die bond layer are secured even when picking up the semiconductor chip with the die bond layer that is formed by dicing, the semiconductor chip with the die bond layer can be easily peeled from the pressure-sensitive adhesive layer.

It is preferable that the arithmetic mean roughness X (μm) on the pressure-sensitive adhesive layer side in the die bond layer is larger than the arithmetic mean roughness Y (μm) on the die bond layer side in the pressure-sensitive adhesive layer. By making the arithmetic mean roughness on the pressure-sensitive adhesive layer side in the die bond layer larger than the arithmetic mean roughness of the pressure-sensitive adhesive layer, the adhesive force of the die bond layer to the pressure-sensitive adhesive layer can be decreased with a condition of maintaining the adhesive force of the pressure-sensitive adhesive layer to the die bond layer. Thus, both of the adhesive properties during the dicing step and the peeling properties during the pickup step can be made to be good.

It is preferable that the die bond layer is constituted by including a rubber component, an epoxy resin component, and inorganic filler materials.

It is preferable that the content of the inorganic filler materials is in the range of 20 to 80 parts by weight based on 100 parts by weight of an organic resin composition. It is preferable that the average particle size of the inorganic filler materials is in the range of 0.1 to 5 μm. By making each of the content and the average particle size of inorganic filler materials within the above-described value range, the arithmetic mean roughness of the surface of the die bond layer can be made to be in the range of 0.015 μm to 1 μm.

It is preferable that the die bond layer is constituted by including a thermoplastic resin.

It is preferable that the bond layer is constituted by including a thermosetting resin and a thermoplastic resin.

It is preferable that the thermoplastic resin is an acrylic resin. Because an acrylic resin has fewer ionic impurities and the heat resistance is high, reliability of the semiconductor element can be secured.

It is preferable that the thermosetting resin is at least any one of an epoxy resin or a phenol resin. Because these resins have fewer ionic impurities and the heat resistance is high, reliability of the semiconductor element can be secured.

It is preferable that a cross-linking agent is added into the die bond layer.

Effect of the Invention

The present invention has an effect described below by the means explained above.

That is, according to the present invention, because the arithmetic mean roughness X (μm) on the pressure-sensitive adhesive layer side in the die bond layer is made to be 0.015 to 1 μm, the arithmetic mean roughness Y (μm) on the die bond layer side in the pressure-sensitive adhesive layer is made to be 0.03 to 1 μm, and the absolute value of the difference of the above-described X and Y is made to be 0.015 or more, without completely adhering the adhesion surface of the pressure-sensitive adhesive layer and the die bond layer, a region where both layers are adhered and a region where they are not adhered are formed. As a result, both of the adhesive properties during the dicing step and the peeling properties during the pickup step are made to be good, the production cost is decreased, and manufacturing of the semiconductor device becomes possible by improving the yield.

BRIEF DESCRIPTION OF THE DRAWINGS

FIG. 1 is a cross-sectional schematic drawing showing a dicing die-bonding film according to one embodiment of the present invention.

FIG. 2 is a cross-sectional schematic drawing showing another dicing die-bonding film according to the above-described embodiment of the present invention.

FIG. 3 is a cross-sectional schematic drawing showing an example of mounting a semiconductor chip with a die-bonding film in the above-described dicing die-bonding film.

FIG. 4 is a cross-sectional schematic drawing showing an example of three-dimensionally mounting a semiconductor chip through a die-bonding film in the above-described dicing die-bonding film.

FIG. 5 is a cross-sectional schematic drawing showing an example of three-dimensionally mounting two semiconductor chips with a die-bonding film through a spacer in the above-described dicing die-bonding film using the above-described dicing die-bonding film.

EXPLANATION OF THE REFERENCE NUMERALS

1 Base material
2 Pressure-Sensitive Adhesive Layer
2a Portion
2b Portion
3, 3' Die-bonding layer
3a Portion
3b Portion
10, 11 Dicing die-bonding film

BEST MODE FOR CARRYING OUT THE INVENTION

The embodiment of the present invention is explained below while referring to the drawings. However, parts that are unnecessary for the explanation are omitted, and parts are shown in the drawing by magnifying, shrinking, etc. in order to make the explanation easy.

As shown in FIG. 1, a dicing die-bonding film 10 has a configuration in which a pressure-sensitive adhesive layer 2 and a die bond layer 3 are laminated on a base material 1 one by one. Further, as shown in FIG. 2, it may have a configuration in which a die bond layer 3' is formed only on a workpiece pasting portion.

The arithmetic mean roughness X (μm) of the pressure-sensitive adhesive layer 2 side in the die bond layers 3, 3' is in the range of 0.015 μm to 1 μm, preferably 0.05 μm to 1 μm, more preferably 0.1 μm to 1 μm, and particularly preferably 0.2 μm to 1 μm. Further, the arithmetic mean roughness Y (μm) of the die bond layers 3, 3' side in the pressure-sensitive adhesive layer 2 is in the range of 0.03 μm to 1 μm, preferably 0.03 μm to 0.5 μm, more preferably 0.03 μm to 0.1 μm, and particularly preferably 0.03 μm to 0.05 μm. When the arithmetic mean roughness X of the die bond layers 3, 3' is less than 0.015 μm or the arithmetic mean roughness Y of the pressure-sensitive adhesive layer 2 is less than 0.03 μm, the contact area of the pressure-sensitive adhesive layer 2 with the die bond layers 3, 3' becomes too large and adhesion becomes high. As a result, peeling of the die bond layers 3, 3' from the pressure-sensitive adhesive layer 2 becomes difficult during the pickup step described later. On the other hand, when the arithmetic mean roughness X of the die bond layers 3, 3' or the arithmetic mean roughness Y of the pressure-sensitive adhesive layer 2 exceeds 1 μm, the contact area of the pressure-sensitive adhesive layer 2 with the die bond layers 3, 3' becomes too small and adhesion becomes low. As a result, the semiconductor chip that is fixed on the die bond layers 3, 3' peels from the pressure-sensitive adhesive layer 2 with the die bonding layers 3, 3' during the pickup step described later, and so-called chip fly occurs. Further, when the semiconductor chip with the die bond layers 3, 3' is die-bonded onto an adherent, a space is generated between the die bond layers 3, 3' and the adherent, and when the semiconductor device is manufactured with this space remaining, there is a case that its reliability decreases.

Further, the absolute value of the difference of the arithmetic mean roughness X (μm) of the pressure-sensitive adhesive layer 2 side in the die bond layers 3, 3' and the arithmetic mean roughness Y (μm) of the die bond layers 3, 3' side in the pressure-sensitive adhesive layer 2 is 0.015 or more, preferably 0.025 or more, and more preferably 0.03 to 0.12. When the absolute value of the difference of the above-described X and Y is less than 0.015, the adhesion surface of the pressure-sensitive adhesive layer 2 with the die bond layers 3, 3' adheres excessively, and as a result, peeling of the die bond layers 3, 3' from the pressure-sensitive layer 2 becomes difficult during the pickup step described later.

The arithmetic mean roughness X (μm) of the die bond layers 3, 3' is preferably larger than the arithmetic mean roughness Y (μm) of the pressure-sensitive adhesive layer 2. The size relation in this case is satisfied in the range in which the absolute value of the difference of the above-described X and Y becomes 0.015 or more.

The method of adjusting the arithmetic mean roughness of the surface of the pressure-sensitive layer 2 or the die bond layers 3, 3' within the above-described value range is not particularly limited. An example is a coating method that is capable of roughening the surface. An example of a typical coating method is a method of coating an adhesive composition in which a prescribed amount of inorganic filler materials are compounded using a comma coat method, a fountain method, a gravure method, etc.

The mean roughness of the surface on the pressure-sensitive adhesive layer 2 side in the die bond layers 3, 3' and of the surface on the die bond layers 3, 3' side in the pressure-sensitive adhesive layer 2 can be controlled by appropriately setting the coating condition of the above-described coating method and the drying condition after coating. Specifically, by variously setting the coating rate during coating, the film thickness of the coating film, the amount of dry air during drying, and the drying temperature, how a solvent in the coating liquid evaporates and convection in the coating film can be changed, and the mean roughness can be controlled to be an arithmetic mean roughness within the above-described range.

Moreover, the above-described arithmetic mean roughness is an arithmetic mean roughness defined by JIS surface roughness (B0601). An example of a measuring method of the arithmetic mean roughness is a method using a noncontact three-dimensional surface profile measuring apparatus NT8000 manufactured by Veeco Instruments, New View 5032 manufactured by ZYGO Corporation, an atomic force microscope SPM-9500 type manufactured by Shimadzu Corporation, etc.

Next, each constitutional member that configures the dicing die-bonding film 10 according to the present embodiment is described in detail.

The base material 1 has ultraviolet ray transparency and is a strength matrix of the dicing die-bonding films 10, 11. Examples thereof include polyolefin such as low-density polyethylene, straight chain polyethylene, intermediate-density polyethylene, high-density polyethylene, very low-density polyethylene, random copolymer polypropylene, block copolymer polypropylene, homopolypropylene, polybutene, and polymethylpentene; an ethylene-vinylacetate copolymer; an ionomer resin; an ethylene(meth)acrylic acid copolymer; an ethylene(meth)acrylic acid ester (random or alternating) copolymer; an ethylene-butene copolymer; an ethylene-hexene copolymer; polyurethane; polyester such as polyethyleneterephthalate and polyethylenenaphthalate; polycarbonate; polyetheretherketone; polyimide; polyetherimide; polyamide; whole aromatic polyamides; polyphenylsulfide; aramid (paper); glass; glass cloth; a fluorine resin; polyvinyl chloride; polyvinylidene chloride; a cellulose resin; a silicone resin; metal (foil); and paper.

Further, the material of the base material 1 includes a polymer such as a cross-linked body of the above resins. The above plastic film may be also used unstretched, or may be also used on which a monoaxial or a biaxial stretching treatment is performed depending on necessity. According to resin sheets in which heat shrinkable properties are given by the stretching treatment, etc., the adhesive area of the pressure-sensitive adhesive layer 2 and the die-bonding layers 3, 3' is reduced by thermally shrinking the base material 1 after dicing, and the recovery of the semiconductor chips can be facilitated.

A known surface treatment such as a chemical or physical treatment such as a chromate treatment, ozone exposure, flame exposure, high voltage electric exposure, and an ionized radiation treatment, and a coating treatment by an undercoating agent (for example, a tacky substance described later) can be performed on the surface of the base material 1 in order to improve adhesiveness, holding properties, etc. with the adjacent layer.

The same type or different type of base material can be appropriately selected and used as the base material 1, and a base material in which a plurality of types are blended can be used depending on necessity. Further, a vapor-deposited layer of a conductive substance composed of a metal, an alloy, an oxide thereof, etc. and having a thickness of about 30 to 500 angstrom can be provided on the base material 1 in order to give an antistatic function to the base material 1. The base material 1 may be a single layer or a multi layer of two or more types.

The thickness of the base material 1 can be appropriately decided without limitation particularly. However, it is generally about 5 to 200 μm.

The pressure-sensitive adhesive layer 2 is constituted by containing an ultraviolet-curable pressure-sensitive adhesive. The ultraviolet-curable pressure-sensitive adhesive can easily decrease its adhesive strength by increasing the degree of crosslinking by irradiation with ultraviolet ray. By radiating only a part 2a corresponding to the semiconductor wafer pasting part of the pressure-sensitive adhesive layer 2 shown in FIG. 2, a difference of the adhesive strength to another part 2b can be also provided.

Further, by curing the ultraviolet-curable pressure-sensitive adhesive layer 2 with the die-bonding layer 3' shown in FIG. 2, the part 2a in which the adhesive strength is remarkably decreased can be formed easily. Because the die-bonding layer is pasted to the part 2a in which the adhesive strength is decreased by curing, the interface of the part 2a of the pressure-sensitive adhesive layer 2 and the die-bonding layer 3' has a characteristic of being easily peeled during pickup. On the other hand, the part not radiated by ultraviolet rays has sufficient adhesive strength, and forms the part 2b.

As described above, in the pressure-sensitive adhesive layer 2 of the dicing die-bonding film 10 shown in FIG. 1, the part 2b formed by a non-cured ultraviolet-curable pressure-sensitive adhesive sticks to the die-bonding layer 3, and the holding force when dicing can be secured. In such a way, the ultraviolet-curable pressure-sensitive adhesive can support the die-bonding layer 3 for fixing the semiconductor chip onto an adherend such as a substrate with good balance of adhesion and peeling. In the pressure-sensitive adhesive layer 2 of the dicing die-bonding film 11 shown in FIG. 2, a dicing ring is fixed to the part 2b.

The ultraviolet-curable pressure-sensitive adhesive having an ultraviolet-curable functional group such as a carbon-carbon double bond, and showing adhesiveness can be used especially without limitation. An example of the ultraviolet-curable pressure-sensitive adhesive includes an adding type radiation-curable pressure-sensitive adhesive, in which an ultraviolet-curable monomer component or oligomer component is compounded into a general pressure-sensitive adhesive such as the above-described acrylic adhesive and rubber adhesive.

The pressure-sensitive adhesive is preferably an acryl pressure-sensitive adhesive that is the base polymer from the viewpoint of clean washing properties of electric parts which should not be contaminated such as a semiconductor wafer and a glass with ultrapure water and an organic solvent such as alcohol.

Examples of the acrylic polymer include acrylic polymers each comprising, as one or more monomer components, one or more selected from alkyl esters of (meth)acrylic acid (for example, linear and branched alkyl esters thereof each having an alkyl group having 1 to 30 carbon atoms, in particular, 4 to 18 carbon atoms, such as methyl ester, ethyl ester, propyl ester, isopropyl ester, butyl ester, isobutyl ester, s-butyl ester, t-butyl ester, pentyl ester, isopentyl ester, hexyl ester, heptyl ester, octyl ester, 2-ethylhexyl ester, isooctyl ester, nonyl ester, decyl ester, isodecyl ester, undecyl ester, dodecyl ester, tridecyl ester, tetradecyl ester, hexadecyl ester, octadecyl ester, and eicosyl ester thereof) and cycloalkyl esters of (meth)acrylic acid (for example, cyclopentyl ester and cyclohexyl ester thereof). The wording "esters of (meth)acrylic acid" means esters of acrylic acid and/or methacrylic acid. All of the words including "(meth)" in connection with the present invention have an equivalent meaning.

The acrylic polymer may optionally contain a unit corresponding to a different monomer component copolymerizable with the above-mentioned alkyl ester of (meth)acrylic acid or cycloalkyl ester thereof in order to improve the cohesive force, heat resistance or some other property of the polymer. Examples of such a monomer component include carboxyl-containing monomers such as acrylic acid, methacrylic acid, carboxyethyl (meth)acrylate, carboxypentyl(meth)acrylate, itaconic acid, maleic acid, fumaric acid, and crotonic acid; acid anhydride monomers such as maleic anhydride, and itaconic anhydride; hydroxyl-containing monomers such as 2-hydroxyethyl (meth)acrylate, 2-hydroxypropyl(meth)acrylate, 4-hydroxybutyl(meth)acrylate, 6-hydroxyhexyl(meth)acrylate, 8-hydroxyoctyl(meth)acrylate, 10-hydroxydecyl(meth)acrylate, 12-hydroxylauryl(meth)acrylate, and (4-hydroxylmethylcyclohexyl)methyl(meth)acrylate; sulfonic acid group containing monomers such as styrenesulfonic acid, allylsulfonic acid, 2-(meth)acrylamide-2-methylpropanesulfonic acid, (meth)acrylamidepropanesulfonic acid, sulfopropyl (meth)acrylate, and (meth)acryloyloxynaphthalenesulfonic acid; phosphoric acid group containing monomers such as 2-hydroxyethylacryloyl phosphate; acrylamide; and acrylonitrile. These copolymerizable monomer components may be used alone or in combination of two or more thereof. The amount of the copolymerizable monomer(s) to be used is preferably 40% or less by weight of all the monomer components.

For crosslinking, the acrylic polymer can also contain multifunctional monomers if necessary as the copolymerizable monomer component. Such multifunctional monomers include hexane diol di(meth)acrylate, (poly)ethylene glycol di(meth)acrylate, (poly)propylene glycol di(meth)acrylate, neopentyl glycol di(meth)acrylate, pentaerythritol di(meth)acrylate, trimethylol propane tri(meth)acrylate, pentaerythritol tri(meth)acrylate, dipentaerythritol hexa(meth)acrylate, epoxy(meth)acrylate, polyester (meth)acrylate, urethane (meth)acrylate etc. These multifunctional monomers can also be used as a mixture of one or more thereof. From the viewpoint of adhesiveness etc., the use amount of the multifunctional monomer is preferably 30 wt % or less based on the whole monomer components.

The acryl polymer can be obtained by polymerizing a single monomer or a monomer mixture of two or more types. The polymerization can be performed with any of methods such as solution polymerization, emulsifying polymerization, bulk polymerization, and suspension polymerization. From the viewpoint of prevention of contamination to a clean adherend, etc., the content of a low molecular weight substance is preferably small. From this viewpoint, the weight average molecular weight of the acryl polymer is preferably 30,000 or more, and more preferably about 400,000 to 3,000,000.

For the above-mentioned adhesive, an external crosslinking agent may be appropriately used in order to heighten the number-average molecular weight of the acrylic polymer or the like as the base polymer. A specific example of the method of using the external crosslinking agent may be a method of adding, to the base polymer, the so-called crosslinking agent, such as a polyisocyanate compound, epoxy compound, aziridine compound or melamine type crosslinking agent, so as to cause crosslinking reaction. In the case that the external crosslinking agent is used, the amount thereof is appropriately decided in accordance with the balance with the amount of the base polymer to be crosslinked and further the use purpose of the adhesive. In general, the amount of the external cross-linking agent is preferably 5 or less parts by weight to 100 parts by weight of the base polymer, more preferably about 0.1 to 5 parts by weight. If necessary, any conventional additive such as a tackifier, and an antioxidant may be added in addition to the above components.

The UV curing monomer component to be compounded includes, for example, polyvalent alcohol (meth)acrylates such as trimethylol propane tri(meth)acrylate, tetramethylol methane tetra(meth)acrylate, pentaerythritol tri(meth)acrylate, pentaerythritol tetra(meth)acrylate, dipentaerythritol monohydroxy penta(meth)acrylate, dipentaerythritol hexa(meth)acrylate, 1,9-butane diol di(meth)acrylate, tetraethylene glycol di(meth)acrylate, 1,6-hexane diol (meth)acrylate, neopentyl glycol di(meth)acrylate etc.; ester acrylate oligomers; and isocyanurates or isocyanurate compounds such as 2-propenyl-3-butenyl cyanurate, tris(2-methacryloxyethyl) isocyanurate etc. The UV curing oligomer component includes various acrylate oligomers such as those based on urethane, polyether, polyester, polycarbonate, polybutadiene etc., and their molecular weight is preferably in the range of about 100 to 30000. For the compounded amount of the radiation-curable monomer component or oligomer component, the amount of which the adhesive strength of the pressure-sensitive adhesive layer can be decreased can be determined appropriately depending on the type of the above-described pressure-sensitive adhesive layer. In general, the compounded amount is, for example, 5 to 500 parts by weight relative to 100 parts by weight of the base polymer such as an acrylic polymer constituting the pressure-sensitive adhesive, and preferably about 40 to 150 parts by weight.

The radiation-curing pressure-sensitive adhesive includes an internal radiation-curing pressure-sensitive adhesive using a base polymer having a carbon-carbon double bond in a polymer side chain, in a main chain or at the end of the main chain, in addition to the addition-type radiation-curing pressure-sensitive adhesive described above. The internal radiation-curing pressure-sensitive adhesive does not require incorporation of low-molecular components such as oligomer components etc., or does not contain such compounds in a large amount, and thus the oligomer components etc. do not move with time through the pressure-sensitive adhesive, thus preferably forming the pressure-sensitive adhesive layer having a stabilized layer structure.

As the base polymer having a carbon-carbon double bond, a polymer having a carbon-carbon double bond and exhibiting tackiness can be used without particular limitation. Such base polymer is preferably a polymer having an acrylic polymer as a fundamental skeleton. The fundamental skeleton of the acrylic polymer includes the acrylic polymer illustrated above.

The method of introducing a carbon-carbon double bond into the acrylic polymer is not particularly limited, and various methods can be used, and the introduction of the carbon-carbon double bond into a polymer side chain is easy in molecular design. There is, for example, a method that after a monomer having a functional group is copolymerized with the acrylic polymer, a compound having a carbon-carbon double bond and a functional group capable of reacting with the above functional group is subjected to condensation or addition reaction therewith while the radiation-curing properties of the carbon-carbon double bond is maintained.

A combination of these functional groups includes combinations of carboxylic acid group and epoxy group, carboxylic acid group and aziridyl group, or hydroxy group and isocyanate group. Among these combinations of functional groups, the combination of hydroxyl group and isocyanate group is preferable for easiness of monitoring the reaction. The functional groups may be present in either the acrylic polymer or the above compound insofar as a combination of the functional groups forms the acrylic polymer having a carbon-carbon double bond, and in the preferable combination described above, it is preferable that the acrylic polymer has a hydroxyl group, and the above compound has an isocyanate group. In this case, the isocyanate compound having a carbon-carbon double bond includes, for example, methacryloyl isocyanate, 2-methacryloyloxyethyl isocyanate, m-isopropenyl-α,α-dimethyl benzyl isocyanate. As the acrylic polymer, copolymers of the above-mentioned hydroxy group-containing monomer and an ether compound such as 2-hydroxyethyl vinyl ether, 4-hydroxy butyl vinyl ether or diethylene glycol monovinyl ether are used.

As the internal radiation-curing pressure-sensitive adhesive, the base polymer having a carbon-carbon double bond (particularly acrylic polymer) can be used solely, but the radiation-curing monomer component and the oligomer component can also be compounded to such an extent that the features of the pressure-sensitive adhesive are not deteriorated. The radiation-curable oligomer component, or the like, is in the range of 0 to 30 parts by weight relative to 100 parts by weight of a normal base polymer, and preferably in the range of 0 to 10 parts by weight.

For curing with UV rays, a photopolymerization initiator is incorporated into the radiation-curing pressure-sensitive adhesive. The photopolymerization initiator includes, for example, α-ketol compounds such as 4-(2-hydroxyethoxy)phenyl(2-hydroxy-2-propyl)ketone, α-hydroxy-α,α'-dimethyl acetophenone, 2-methyl-2-hydroxypropiophenone, 1-hydroxycyclohexyl phenyl ketone etc.; acetophenone compounds such as methoxyacetophenone, 2,2-dimethoxy-2-phenylacetophenone, 2,2-diethoxyacetophenone, 2-methyl-1-[4-(methylthio)-phenyl]-2-morpholinopropane-1 etc.; benzoin ether compounds such as benzoin ethyl ether, benzoin isopropyl ether, anisoin methyl ether etc.; ketal compounds such as benzyl dimethyl ketal etc.; aromatic sulfonyl chloride compounds such as 2-naphthalene sulfonyl chloride etc.; optically active oxime compounds such as 1-phenone-1,1-propanedione-2-(o-ethoxycarbonyl)oxime etc.; benzophenone compounds such as benzophenone, benzoylbenzoic acid, 3,3'-dimethyl-4-methoxybenzophenone etc.; thioxanthone compounds such as thioxanthone, 2-chlorothioxanthone, 2-methyl thioxanthone, 2,4-dimethyl thioxanthone, isopropyl thioxanthone, 2,4-dichlorothioxanthone, 2,4-diethyl thioxanthone, 2,4-diisopropyl thioxanthone etc.; camphor quinone; halogenated ketone; acyl phospinoxide; acyl phosphonate etc. The amount of the photopolymerization initiator to be incorporated is for example about 0.05 to 20 parts by weight, based on 100 parts by weight of the base polymer such as acrylic polymer etc. constituting the pressure-sensitive adhesive.

The radiation-curing pressure-sensitive adhesive includes, for example, those disclosed in JP-A 60-196956, such as a rubber-based pressure-sensitive adhesive and an acrylic pressure-sensitive adhesive, comprising an addition-polymerizable compound having two or more unsaturated bonds, a photopolymerizable compound such as alkoxysilane having an epoxy group, and a photopolymerization initiator such as a carbonyl compound, an organic sulfur compound, a peroxide, an amine or an onium salt compound.

The adhesive force of the above-described pressure-sensitive adhesive layer 2 is preferably 0.04 to 0.2 N/10 mm-width to the die bond layers 3, 3', and more preferably 0.06 to 0.1N/10 mm-width (20 degree peel releasing force, peeling rate 300 mm/mm). If it is within the above-described value range, when picking up the semiconductor chip with the adhesive of the die-bonding film, better pickup properties can be expected without fixing the semiconductor chip more than necessary.

The method of forming the part 2a in the pressure-sensitive adhesive layer 2 includes a method of forming the radiation curable pressure-sensitive adhesive layer 2 on the base material 1 and then radiating the part 2a with radiation partially and curing. The partial radiation irradiation can be performed through a photo mask in which a pattern is formed which is corresponding to a part 3b, etc. other than the semiconductor wafer pasting part 3a. Further, examples include a method of radiating in a spot manner and curing, etc. The formation of the radiation curable pressure-sensitive adhesive layer 2 can be performed by transferring the pressure-sensitive adhesive layer provided on a separator onto the base material 1. The partial radiation curing can be also performed on the radiation curable pressure-sensitive adhesive layer 2 provided on the separator.

In the pressure-sensitive adhesive layer 2 of the dicing die-bonding film 10, the radiation irradiation may be performed on a part of the pressure-sensitive adhesive layer 2 so that the adhesive strength of the part 2a becomes smaller than the adhesive strength of other parts 2b. That is, the part 2a in which the adhesive strength is decreased can be formed by using those in which the entire or a portion of the part other than the part corresponding to the semiconductor wafer pasting part 3a on at least one face of the base material 1 is shaded, forming the radiation curable pressure-sensitive adhesive layer 2 onto this, then radiating radiation, and curing the part corresponding the semiconductor wafer pasting part 3a. The shading material that can be a photo mask on a supporting film can be manufactured by printing, vapor deposition, etc. Accordingly, the dicing die-bonding film 10 of the present invention can be produced with efficiency.

The thickness of the pressure-sensitive adhesive layer 2 is not particularly limited. However, it is preferably about 1 to 50 µm from the viewpoints of compatibility of chipping prevention of the chip cut face and holding the fixation of the adhesive layer, etc. It is preferably 2 to 30 µm, and further preferably 5 to 25 µm.

The above-described adhesive layer is a layer having an adhesion function, and its constituting materials include a material using a thermoplastic resin and a thermosetting resin together. Further, a thermoplastic resin can be used alone.

A layered structure of the die-bonding layer 3, 3' is not especially limited. For example, a die-bonding film consisting of only a single adhesive layer and a die-bonding film having a multi-layered structure in which an adhesive layer is laminated on one face of a core material can be mentioned. Further, the adhesive layer may be provided on both faces of the core material. Examples of the core materials include such as a film (for example, a polyimide film, a polyester film, a polyethyleneterephthalate film, a polyethylenenaphthalate film, a polycarbonate film, etc.), a resin substrate reinforced with a glass fiber or a plastic nonwoven fiber, a silicon substrate, and a glass substrate.

Examples of the thermoplastic resin include natural rubber, butyl rubber, isoprene rubber, chloroprene rubber, ethylene/vinyl acetate copolymer, ethylene/acrylic acid copolymer, ethylene/acrylic ester copolymer, polybutadiene resin, polycarbonate resin, thermoplastic polyimide resin, polyimide resins such as 6-nylon (registered trademark) and 6,6-nylon (registered trademark), phenoxy resin, acrylic resin, saturated polyester resins such as PET and PBT, polyamideimide resin, and fluorine-contained resin. These thermoplastic resins may be used alone or in combination of two or more thereof. Of these thermoplastic resins, acrylic resin is particularly preferable since the resin contains ionic impurities in only a small amount and has a high heat resistance so as to make it possible to ensure the reliability of the semiconductor element.

The acrylic resin is not limited to any especial kind, and may be, for example, a polymer comprising, as a component or components, one or more esters of acrylic acid or methacrylic acid having a linear or branched alkyl group having 30 or less carbon atoms, in particular, 4 to 18 carbon atoms. Examples of the alkyl group include methyl, ethyl, propyl, isopropyl, n-butyl, t-butyl, isobutyl, amyl, isoamyl, hexyl, heptyl, cyclohexyl, 2-ethylhexyl, octyl, isooctyl, nonyl, isononyl, decyl, isodecyl, undecyl, lauryl, tridecyl, tetradecyl, stearyl, octadecyl, and dodecyl groups.

A different monomer which constitutes the above-mentioned polymer is not limited to any especial kind, and examples thereof include carboxyl-containing monomers such as acrylic acid, methacrylic acid, carboxyethyl acrylate, carboxypentyl acrylate, itaconic acid, maleic acid, fumaric acid, and crotonic acid; acid anhydride monomers such as maleic anhydride and itaconic anhydride; hydroxyl-containing monomers such as 2-hydroxyethyl(meth)acrylate, 2-hydroxypropyl(meth)acrylate, 4-hydroxybutyl(meth)acrylate, 6-hydroxyhexyl(meth)acrylate, 8-hydroxyoctyl(meth)acrylate, 10-hydroxydecyl(meth)acrylate, 12-hydroxylauryl (meth)acrylate, and (4-hydroxymethylcyclohexyl) methylacrylate; monomers which contain a sulfonic acid group, such as styrenesulfonic acid, allylsulfonic acid, 2-(meth)acrylamide-2-methylpropanesulfonic acid, (meth)acrylamidepropane sulfonic acid, sulfopropyl (meth)acrylate, and (meth)acryloyloxynaphthalenesulfonic acid; and monomers which contain a phosphoric acid group, such as 2-hydroxyethylacryloyl phosphate.

Examples of the above-mentioned thermosetting resin include phenol resin, amino resin, unsaturated polyester resin, epoxy resin, polyurethane resin, silicone resin, and thermosetting polyimide resin. These resins may be used alone or in combination of two or more thereof. Particularly preferable is epoxy resin, which contains ionic impurities which corrode semiconductor elements in only a small amount. As the curing agent of the epoxy resin, phenol resin is preferable.

The epoxy resin may be any epoxy resin that is ordinarily used as an adhesive composition. Examples thereof include bifunctional or polyfunctional epoxy resins such as bisphenol A type, bisphenol F type, bisphenol S type, brominated bisphenol A type, hydrogenated bisphenol A type, bisphenol AF type, biphenyl type, naphthalene type, fluorene type, phenol Novolak type, orthocresol Novolak type, tris-hydroxyphenylmethane type, and tetraphenylolethane type epoxy resins; hydantoin type epoxy resins; tris-glycicylisocyanurate type epoxy resins; and glycidylamine type epoxy resins. These may be used alone or in combination of two or more thereof. Among these epoxy resins, particularly preferable are Novolak type epoxy resin, biphenyl type epoxy resin, tris-hydroxyphenylmethane type epoxy resin, and tetraphenylolethane type epoxy resin, since these epoxy resins are rich in reactivity with phenol resin as an agent for curing the epoxy resin and are superior in heat resistance and so on.

The phenol resin is a resin acting as a curing agent for the epoxy resin. Examples thereof include Novolak type phenol resins such as phenol Novolak resin, phenol aralkyl resin, cresol Novolak resin, tert-butylphenol Novolak resin and nonylphenol Novolak resin; resol type phenol resins; and polyoxystyrenes such as poly(p-oxystyrene). These may be used alone or in combination of two or more thereof. Among these phenol resins, phenol Novolak resin and phenol aralkyl resin are particularly preferable, since the connection reliability of the semiconductor device can be improved.

About the blend ratio between the epoxy resin and the phenol resin, for example, the phenol resin is blended with the epoxy resin in such a manner that the hydroxyl groups in the phenol resin is preferably from 0.5 to 2.0 equivalents, more preferably from 0.8 to 1.2 equivalents per equivalent of the epoxy groups in the epoxy resin component. If the blend ratio between the two is out of the range, curing reaction therebetween does not advance sufficiently so that properties of the cured epoxy resin easily deteriorate.

In the present invention, an adhesive sheet comprising the epoxy resin, the phenol resin, and an acrylic resin is particularly preferable. Since these resins contain ionic impurities in only a small amount and have high heat resistance, the reliability of the semiconductor element can be ensured. About the blend ratio in this case, the amount of the mixture of the epoxy resin and the phenol resin is from 10 to 200 parts by weight for 100 parts by weight of the acrylic resin component.

In order to crosslink the adhesive layer 3, 3' of the present invention to some extent in advance, it is preferable to add, as a crosslinking agent, a polyfunctional compound which reacts with functional groups of molecular chain terminals of the above-mentioned polymer to the materials used when the adhesive layer 3 is produced. In this way, the adhesive property of the adhesive layer 3 at high temperatures is improved so as to improve the heat resistance.

The crosslinking agent may be one known in the prior art. Particularly preferable are polyisocyanate compounds, such as tolylene diisocyanate, diphenylmethane diisocyanate, p-phenylene diisocyanate, 1,5-naphthalene diisocyanate, and adducts of polyhydric alcohol and diisocyanate. The amount of the crosslinking agent to be added is preferably set to 0.05 to 7 parts by weight for 100 parts by weight of the above-mentioned polymer. If the amount of the crosslinking agent to be added is more than 7 parts by weight, the adhesive force is unfavorably lowered. On the other hand, if the adding amount is less than 0.05 part by weight, the cohesive force is unfavorably insufficient. A different polyfunctional compound, such as an epoxy resin, together with the polyisocyanate compound may be incorporated if necessary.

An inorganic filler may be appropriately incorporated into the adhesive layer 3, 3' of the present invention in accordance with the use purpose thereof. The incorporation of the inorganic filler makes it possible to confer electric conductance to the sheet, improve the thermal conductivity thereof, and adjust the elasticity.

Examples of the inorganic fillers include various inorganic powders made of the following: a ceramic such as silica, clay, plaster, calcium carbonate, barium sulfate, aluminum oxide, beryllium oxide, silicon carbide or silicon nitride; a metal such as aluminum, copper, silver, gold, nickel, chromium, lead, tin, zinc, palladium or solder, or an alloy thereof; and carbon. These may be used alone or in combination of two or more thereof. Among these, silica, in particular fused silica is preferably used.

The average particle size of the inorganic filler materials is preferably in the range of 0.1 to 5 µm, and more preferably in the range of 0.2 to 3 µm. When the average particle size is less than 0.1 µm, it becomes difficult to make the arithmetic mean roughness of the surface of the die bond layers 3, 3' 0.015 µm or more. On the other hand, when the average particle size exceeds 5 µm, it becomes difficult to make the arithmetic mean roughness of the surface of the die bond layers 3, 3' less than 1 µm.

The compounding amount of the above-described inorganic filler materials is preferably set to be 20 to 80% by weight based on 100 parts by weight of an organic resin component. It is particularly preferably 20 to 70% by weight. When the compounding amount of the inorganic filler materials is less than 20% by weight, the heat resistance decreases, and therefore the die bond layers 3, 3' are cured when being exposed to a thermal history of a high temperature for a long time, and there is a case that fluidity and embedding properties decrease. Further, when it exceeds 80% by weight, the storage elastic modulus of the die bond layers 3, 3' becomes large. Therefore, stress relaxation of the cured adhesive becomes difficult, and there is a case that the embedding properties of the uneven surface decrease in the sealing step.

If necessary, other additives besides the inorganic filler may be incorporated into the die-bonding layer 3, 3' of the present invention. Examples thereof include a flame retardant, a silane coupling agent, and an ion trapping agent.

Examples of the flame retardant include antimony trioxide, antimony pentaoxide, and brominated epoxy resin. These may be used alone or in combination of two or more thereof.

Examples of the silane coupling agent include β-(3,4-epoxycyclohexyl)ethyltrimethoxysilane, γ-glycidoxypropyltrimethoxysilane, and γ-glycidoxypropylmethyldiethoxysilane. These may be used alone or in combination of two or more thereof.

Examples of the ion trapping agent include hydrotalcite and bismuth hydroxide. These may be used alone or in combination of two or more thereof.

The thickness of the die bonding film 3, 3' (in the case that the film is a laminate, the total thickness thereof) is not particularly limited, and is, for example, from about 5 to 100 µm, preferably from about 5 to 50 µm.

The die-bonding layers 3, 3 of the dicing die-bonding films 10, 11 are preferably protected by a separator (not shown). The separator has a function as a protecting material that protects the die-bonding layers 3, 3' until they are practically used. Further, the separator can be used as a supporting base material when transferring the die-bonding layers 3, 3' to the pressure-sensitive adhesive layer 2. The separator is peeled when pasting a workpiece onto the die-bonding layers 3, 3' of the dicing die-bonding film. Polyethylenetelephthalate (PET), polyethylene, polypropylene, a plastic film, a paper, etc. whose surface is coated with a peeling agent such as a fluorine based peeling agent and a long chain alkylacrylate based peeling agent can be also used as the separator.

The die bond layers 3, 3' preferably have elasticity of some level at least in the direction perpendicular to the in-plane direction in the aspect of its adhesive function. On the other hand, in the case that the die bond layers 3, 3' have excessive elasticity as a whole, the elastic force of the die bond layers 3, 3' hinders keeping the lead frame in which the die bond layers 3, 3' are pasted sufficiently fixed even when attempting to connect the bonding wire during wire bonding. As a result, a compression-bonding energy due to the applied pressure is relaxed, and a bonding failure is generated. The above-described wire bonding step is performed under a high temperature condition of about 150° C. to 200° C. Therefore, the tensile storage elastic modulus of the die bond layers 3, 3' at 120° C. before curing is preferably $1\times10^4$ Pa or more, and more preferably 0.1 to 20 Pa. When the above-described tensile storage elastic modulus is less than $1\times10^4$ Pa, the die bond layers 3, 3' that melt during dicing stick to the semiconductor chip for example, and there is a case that the pickup becomes difficult. Further, the tensile storage elastic modulus of the die bond layers 3, 3' at 200° C. post-curing is preferably 50 MPa or less, and more preferably 0.5 MPa to 40 MPa. When it exceeds 50 MPa, there is a case that the embedding properties of the uneven surface of the die bond layers 3, 3' decrease when molding after the wire bonding. Moreover, by making the tensile storage elastic modulus 0.5 MPa or more, a stable connection becomes possible in a semiconductor device that is characterized by a leadless structure. The tensile storage elastic modulus can be adjusted by appropriately adjusting the added amount of phyllosilicate and the inorganic fillers.

As the measuring method of the tensile storage elastic modulus, only the die bond layers 3, 3' are obtained by coating on a peeling line on which a releasing treatment is carried out so that the thickness becomes 100 µm. The die bond layers 3, 3' are left in an oven at 150° C. for 1 hr, and then the tensile storage elastic modulus of the die bond layers 3, 3' at 200° C. is measured using a viscoelasticity measuring apparatus (manufactured by TA Instrument Japan: type: RSA-II). In more detail, the samples size is made to be length 30.0 mm×width 5.0 mm×thickness 0.1 mm, the measurement sample is set in a jig for film tensile measurement, and the measurement is performed under a condition of a temperature range of 50° C. to 250° C., frequency 1.0 Hz, distortion 0.025%, and temperature rising rate 10° C./min.

(Producing Method of Semiconductor Device)

The dicing die-bonding films 10, 11 of the present invention are used as follows by appropriately peeling the separator arbitrarily provided on the die-bonding layers 3, 3'. Hereinbelow, referring to FIGS. 1 to 5, it is described while using the dicing die-bonding 10 as an example.

First, a semiconductor wafer 4 is press-adhered on the die-bonding layer 3' in the dicing die-bonding film 10, and it is fixed by adhering and holding (mounting step). The present step is performed while pressing with a pressing means such as a pressing roll.

Next, the dicing of the semiconductor wafer 4 is performed. Accordingly, the semiconductor wafer 4 is cut into a prescribed size and individualized, and a semiconductor chip is produced. The dicing is performed following a normal method from the circuit face side of the semiconductor wafer 4, for example. Further, the present step can adopt such as a cutting method called full-cut that forms a slit in the dicing die-bonding film 10. The dicing apparatus used in the present step is not particularly limited, and a conventionally known apparatus can be used. Further, because the semiconductor wafer is adhered and fixed by the dicing die-bonding film 10, chip crack and chip fly can be suppressed, and at the same time the damage of the semiconductor wafer can be also suppressed.

Pickup of the semiconductor chip 5 is performed in order to peel a semiconductor chip that is adhered and fixed to the dicing die-bonding film 10. The method of picking up is not particularly limited, and conventionally known various methods can be adopted. Examples include a method of pushing up the individual semiconductor chip 5 from the dicing die-bonding 10 side with a needle and picking up the pushed semiconductor chip 5 with a picking-up apparatus.

Here, the picking up is performed after radiating the pressure-sensitive adhesive layer 2 with ultraviolet rays because the pressure-sensitive adhesive layer 2 is an ultraviolet-curable type pressure-sensitive adhesive layer. Accordingly, the adhesive strength of the pressure-sensitive adhesive layer 2 to the die-bonding layer 3a decreases, and the peeling of the semiconductor chip 5 becomes easy. As a result, picking up becomes possible without damaging the semiconductor chip. The condition such as irradiation intensity and irradiation time when irradiating an ultraviolet ray is not particularly limited, and it may be appropriately set depending on necessity. Further, the light source as described above can be used as a light source used in the ultraviolet irradiation.

The semiconductor chip 5 picked up is adhered and fixed to an adherend 6 through the die-bonding layer 3a interposed therebetween (die-bonding). Examples of the adherend 6 include such as a lead frame, a TAB film, a substrate, and a semiconductor chip separately produced. The adherend 6 may be a deformable adherend that are easily deformed, or may be a non-deformable adherend (a semiconductor wafer, etc.) that is difficult to deform, for example.

A conventionally known substrate can be used as the substrate. Further, a metal lead frame such as a Cu lead frame and a 42 Alloy lead frame and an organic substrate composed of glass epoxy, BT (bismaleimide-triazine), and polyimide can be used as the lead frame. However, the present invention is not limited to this, and includes a circuit substrate that can be used by mounting a semiconductor element and electrically connecting with the semiconductor element.

When the die-bonding layer 3 is a thermosetting type die-bonding film, the semiconductor chip 5 is adhered and fixed onto the adherend 6 by heat-curing to improve the heat resistance strength. Here, a product in which the semiconductor chip 5 is adhered and fixed onto a substrate etc. through the semiconductor wafer pasting part 3a interposed therebetween can be subjected to a reflow step.

Further, in the above-described die bond, the die-bonding layer 3 may be simply temporarily fixed onto the adherend 6 without curing. After that, wire bonding is performed without undergoing the heating step, the semiconductor chip is sealed with a sealing resin, and the sealing resin can be post-cured.

In this case, as the die-bonding layer 3, a die-bonding film having a shearing adhering strength during the temporary fixing of 0.2 MPa or more is preferably used, and more preferably a die-bonding film is used having that a shearing adhering strength is in the range of 0.2 to 10 MPa. When the shearing adhering strength of the die-bonding layer 3 is 0.2 MPa or more, even when performing the wire bonding step without going through the heating step, shear deformation due to ultrasonic vibration or heating in the corresponding step does not occur in the adhesion surface of the die-bonding layer 3 with the semiconductor chip 5 or the adherent 6. That is, the semiconductor element does not move due to the ultrasonic vibration during wire bonding, and thereby preventing the success rate of the wire bonding from decreasing.

The wire bonding step is a step of connecting tips of terminal, moieties (inner leads) of the adherend 6 electrically with electrode pads (not illustrated) on the semiconductor chip 5 through bonding wires 7. The bonding wires 7 may be, for example, gold wires, aluminum wires, or copper wires. The temperature when the wire bonding is performed is from 80 to 250° C., preferably from 80 to 220° C. The heating time is from several seconds to several minutes. The connection of the wires is performed by using a combination of vibration energy based on ultrasonic waves with compression energy based on the application of pressure in the state that the wires are heated to a temperature in the above-mentioned range.

The present step may be carried out without any sticking/fixing based on the die bonding film 3a. In this case, the semiconductor chip 5 is not bonded to the adherend 6 through the die bonding film 3a in the process of the step.

The above-mentioned sealing step is a step of sealing the semiconductor chip 5 with a sealing resin 8 (see FIG. 3), and is performed to protect the semiconductor chip 5 and the bonding wires 7 mounted on the adherend 6 or the like. The present step is performed by molding the sealing resin with a mold or die. The sealing resin 8 may be, for example, an epoxy resin. The heating for the resin-sealing is performed usually at 175° C. for 60 to 90 seconds. In this invention, however, the heating is not limited to this, and may be performed, for example at 165 to 185° C. for several minutes. In such a way, the sealing resin is cured and further the semiconductor chip 5 and the adherend 6 or the like are set to each other through the die-bonding layer 3a. In this way, the sealing resin is cured. In addition thereto, in the case of the above-mentioned temporary sticking/fixing, the semiconductor chip 5 is bonded onto the adherend 6 through the die bonding film 3a. In short, even if the post-curing step, which will be detailed later, is not performed in this invention, the sticking/fixing based on the die-bonding layer 3a can be attained in the present step so that the number of the producing steps can be reduced and the term for producing the semiconductor device can be shortened.

In the post-curing step, the sealing resin 8, which is not sufficiently cured in the sealing step, is completely cured. Even if the semiconductor chip 5 and the adherend 6 or the like are not set to each other through the die-bonding layer 3a in the sealing step, the sealing resin 8 is cured and further they are set through the die-bonding layer 3a in the present step. The heating temperature in the present step is varied dependently on the kind of the sealing resin, and is, for example, in the range of 165 to 185° C. The heating time is from about 0.5 to 8 hours.

The dicing die-bonding film of the invention also can be preferably used in the case of three-dimensional mounting also in which plural semiconductor chips are laminated, as illustrated in FIG. 4. FIG. 4 is a schematic sectional view illustrating an example wherein semiconductor chips are three-dimensionally mounted through a die bonding film. In the case of the three-dimensional mounting illustrated in FIG. 4, at least one die bonding film 3a cut out so as to have a size equal to that of a semiconductor chip 5 is bonded to a adherend 6, and then the semiconductor chip 5 is bonded onto the adherend 6 through the die bonding film 3a so as to direct its wire bonding face upwards. Next, a die bonding film 13 is bonded onto the semiconductor chip 5 avoiding its electrode pad portions. Furthermore, another semiconductor chip 15 is bonded onto the die bonding film 13 so as to direct its wire bonding face upwards.

Then, the wire bonding step is performed without performing the heating step. By the step, each electrode pad in the semiconductor chip 5 and the semiconductor chip 15 is electrically connected with a bonding wire 7.

Subsequently, a sealing step of sealing the semiconductor chips 5 with a sealing resin 8 is performed to cure the sealing resin 8. In addition thereto, the adherend 6 and one of the semiconductor chips 5 are bonded to each other through the die bonding film 3a. One of the semiconductor chips 5 and one of another semiconductor chips 15 are bonded to each other. After the sealing step, an post-curing step may be performed.

In the case of the three-dimensional mounting of the semiconductor chips, the production process is simplified and the yield is improved since heating treatment by heating the die bonding films 3a and 13 is not conducted. Furthermore, the adherend 6 is not warped, and the semiconductor chips 5 and 15 are not cracked; thus, the semiconductor element can be made still thinner.

Three-dimensional mounting may performed in which semiconductor chips are laminated through die bonding films so as to interpose a spacer between the semiconductor chips, as illustrated in FIG. 5. FIG. 5 is a schematic sectional view illustrating an example wherein two semiconductor chips are three-dimensionally mounted through die bonding films so as to interpose a spacer between the chips.

In the case of the three-dimensional mounting illustrated in FIG. 5, first, a die bonding film 3a, a semiconductor chip 5, and a die bonding film 21 are successively laminated on a adherend 6 to bond these members. Furthermore, on the die bonding film 21 are successively laminated a spacer 9, another die bonding film 21, another die bonding film 3a, and another semiconductor chip 5 to bond these members.

Next, as illustrated in FIG. 5, a wire bonding step is performed. In this way, electrode pads on the semiconductor chips 5 are electrically connected with the adherend 6 through bonding wires 7. In the case of the above-mentioned temporary sticking/fixing, the present step is carried out by way of no heating step.

Subsequently, a sealing step of sealing the semiconductor chips 5 with a sealing resin 8 is performed to cure the sealing resin 8. In addition thereto, in the case of the above-mentioned temporary sticking/fixing, the adherend 6 and one of the semiconductor chips 5 are bonded to each other, and the semiconductor chips 5 and the spacer 9 are bonded to each other through the die bonding films 3a and 21. In this way, a semiconductor package is obtained. The sealing step is preferably performed by a package sealing method wherein only the semiconductor chip 5 is sealed. The sealing is performed to protect the semiconductor chips 5 adhered onto the adhesive sheet (s). The method therefore is typically a method of using the sealing resin 8 and molding the resin 8 in a metal mold. At this time, it is general to use a metal mold composed of an upper metal mold part and a lower metal mold part and having plural cavities to seal simultaneously. The heating temperature at the time of the sealing preferably ranges, for example, from 170 to 180° C. After the sealing step, an post-curing step may be performed.

The spacer 9 is not particularly limited, and may be made of, for example, a silicon chip or polyimide film and the like known in the prior art. The spacer may be a core member. The core member is not particularly limited, and may be a core member known in the prior art. Specific examples thereof include films (such as a polyimide film, a polyester film, a polyethylene terephthalate film, a polyethylene naphthalate film, a polycarbonate film and the like), resin substrates each reinforced with glass fiber or plastic nonwoven fiber, mirror silicon wafers, silicon substrates, and glass substrates.

(Other Matters)

When semiconductor elements are three-dimensional mounted onto any one of the above-mentioned substrates, a buffer coat layer may be formed on the substrate surface on which circuits of the semiconductor elements are formed. The buffer coat layer may be, for example, a silicon nitride film, or a layer made of a heat-resistant resin such as polyimide resin.

The compositions of the adhesive sheets used in the respective stages at the time of the three-dimensional mounting of the semiconductor elements may be the same, but not limited thereto, and may be appropriately varied dependently on the producing conditions or use purposes thereof, or the like.

About the above-mentioned embodiments, there are described embodiments wherein semiconductor elements are laminated on a substrate or the like and subsequently all the elements are subjected to a wire bonding step at a time. However, the present invention is not limited to the embodiments. For example, a wire bonding step may be performed every time when semiconductor elements are laminated on or over a substrate or the like.

Example

Below, preferred examples of the present invention are explained in detail. However, materials, addition amounts, and the like described in these examples are not intended to limit the scope of the present invention, and are only examples for explanation as long as there is no description of limitation in particular.

Example 1

A solution of an adhesive composition having concentration 20% by weight was prepared by dissolving an isocyanate cross-linking agent (Coronate HX manufactured by Nippon Polyurethane Industry Co., Ltd) 3 parts by weight, an epoxy resin (EPIKOTE 1003 manufactured by Japan Epoxy Resins Co., Ltd.) 12 parts, a phenol resin (MILEX XLC-CC manufactured by Mitsui Chemicals, Inc.) 7 parts, and titanium oxide modified silicon dioxide (average particle size: 0.5 µm, ST-600 manufactured by TOKOYAMA Corp.) 20 parts as the inorganic filler materials to a polymer (Parakuron SN-710 manufactured by Negami Chemical Industrial Co., Ltd.) 100 parts by weight having butylacrylate as a main component into methylethylketone.

This solution of the adhesive composition was applied with a fountain coater onto a release treated film (a core material) consisting of a polyethylene terephthalate film (thickness 50 µm) on which a silicone releasing treatment was performed, and it was dried with a hot air jet of 150° C. and 10 m/s. With this, a die-bonding film according to the present Example 1 having a die bond layer of thickness 25 µm was produced on the release treated film.

Example 2

An acrylic pressure-sensitive adhesive was prepared in which 3 parts by weight of an isocyanate cross-linking agent (Coronate HX manufactured by Nippon Polyurethane Industry Co., Ltd) was added to an acrylic pressure-sensitive adhesive material 100 Parts by weight. Moreover, a die bond layer according to the present Example 2 was produced in the same manner as the above-described Example 1 except that an acrylic copolymer having 2-ethylhexyl acrylate 70 parts, n-butyl acrylate 25 parts, and acrylic acid 5 parts by weight as constituting monomers was compounded in the above-described acrylic pressure-sensitive adhesive and that the adhesive solution was prepared by dissolving silicon dioxide (average particle size 0.5 μm manufactured by Nippon Shokubai Co., Ltd.) 30 parts as the inorganic filler materials into methylethylketone so that the concentration become 20% by weight.

Comparative Example 1

In the present Comparative Example 1, a die bond layer according to the present comparative example was produced in the same manner as the above-described Example 1 except that a solution in which the inorganic filler was not added was used as the solution of the adhesive composition.

Comparative Example 2

In the present Comparative Example 1, a die bond layer according to the present comparative example was produced in the same manner as the above-described Example 1 except that the added amount of the inorganic filler was changed to 15 parts by weight.

Evaluation of the Pickup Properties

Evaluations of the arithmetic mean surface roughness, the pickup properties, and the peel releasing force were performed on the die-bonding films in the above-described Examples 1 and 2 and Comparative Examples 1 and 2 with the following methods. These results are as shown Table 1.

Dicing die-bonding films were produced by pasting a dicing film (DU-300 manufactured by Nitto Denko Corporation) onto the die-bonding films obtained in the examples and comparative examples at a laminate temperature of 40° C. and a linear load of 4 kgf/cm.

Furthermore, each dicing die-bonding film was pasted onto the backside of a wafer (diameter 8 inches, thickness 100 μm) at 50° C. The pasting surface of the dicing die-bonding film was made to be the die-bonding film.

Next, the wafer was diced using a dicer. As the dicing condition, the spindle rotation speed was made to be 40,000 rpm and the cutting rate was made to be 50 mm/sec, and semiconductor chips were formed having a 5 mm×5 mm square size.

Next, the pickup of the semiconductor chip was performed, and its success rate was examined. As the pickup condition, the number of needles was made to be 5, the amount of being pulled down was made to be 6 mm, the amount of being plunged up was made to be 400 μm, and the rate of being pushed up was made to be 80 mm/sec. Further, the pickup of 100 semiconductor chips was performed using a pickup apparatus (CPS-100 manufactured by NES Machinery Inc.) For the success rate, the number of the semiconductor chips with the die-bonding film that were able to be peeled from the dicing film without damage to the semiconductor chips was counted.

For the evaluation of the peel releasing force, the peeling force when peeling the die-bonding film from the dicing film in each of the above-described dicing die-bonding films at a peeling rate of 300 mm/min and at 90 degrees was measured at 10 mm width. The result is shown in the following Table 1.

The arithmetic mean roughness X (μm) on the dicing film (the pressure-sensitive adhesive layer) side in the die-bonding film (the die bond layer) and the arithmetic mean roughness Y (μm) on the die-bonding film side in the dicing film were measured based on JIS surface roughness (B0601) using a noncontact three-dimensional roughness measuring apparatus (NT3000) manufactured by WYKO Corporation. They were obtained by processing the measurement data by applying a Median filter with a measurement condition of 50 times. The measurement was performed 5 times by changing the measurement position respectively for each sample, its average value was obtained, and it was made to be the arithmetic mean roughness.

(Result)

As is obvious from Table 1, chip fly during dicing was not generated and good pickup properties were shown in the dicing die-bonding films in Examples 1 and 2. That is, it was shown that the manufacturing of a semiconductor package is possible with improved yield if it is with the dicing die-bonding film in the present examples.

Contrary to this, in the die-bonding film in Comparative Example 1, the peeling properties with the dicing tape were decreased because its surface was too smooth, the pickup could not be performed, and damage such as cracking and chipping were generated in the chips. Further, in the die-bonding film in Comparative Example 2, because the smoothness was lost and the unevenness was large, the adhesion with the dicing tape was decreased and chip fly was generated during pickup.

TABLE 1

|  | EXAMPLE 1 | EXAMPLE 2 | COMPARATIVE EXAMPLE 1 | COMPARATIVE EXAMPLE 2 |
|---|---|---|---|---|
| ARITHMETIC MEAN ROUGHNESS X (μm) OF DIE-BONDING LAYER | 0.06 | 0.22 | 0.045 | 1.1 |
| ARITHMETIC MEAN ROUGHNESS Y (μm) OF DICING LAYER | 0.036 | 0.05 | 0.037 | 0.043 |
| SUCCESS RATE OF PICKUP[%] | 100 | 100 | 0 | 70 |
| PEEL RELEASING FORCE [N/10 mm] | 0.1 | 0.06 | 3.6 | 0.02 |

The invention claimed is:

1. A dicing die-bonding film having a pressure-sensitive adhesive layer on a base material and a die bond layer on the pressure-sensitive adhesive layer, wherein an arithmetic mean roughness X (μm) of the die bond layer, on a pressure-sensitive adhesive layer side, is 0.015 μm to 1 μm, an arithmetic mean roughness Y (μm) of the pressure-sensitive adhesive layer, on a die bond layer side, is 0.03 μm to 1 μm, and the absolute value of the difference of X and Y is 0.015 or more.

2. The dicing die-bonding film according to claim 1, wherein the arithmetic mean roughness X (μm) of the die bond layer, on the pressure-sensitive adhesive layer side, is larger than the arithmetic mean roughness Y (μm) of the pressure-sensitive adhesive layer, on the die bond layer side.

3. The dicing die-bonding film according to claim 1, wherein the die bond layer is constituted by including a rubber component, an epoxy resin component, and inorganic filler materials.

4. The dicing die-bonding film according to claim 3, wherein a content of the inorganic filler materials is in a range of 20 to 80 parts by weight based on 100 parts by weight of an organic resin composition.

5. The dicing die-bonding film according to claim 3, wherein an average particle size of the inorganic filler materials is in a range of 0.1 to 5 μm.

6. The dicing die-bonding film according to claim 1, wherein the die bond layer is constituted by including a thermoplastic resin.

7. The dicing die-bonding film according to claim 6, wherein the thermoplastic resin is an acrylic resin.

8. The dicing die-bonding film according to claim 1, wherein the die bond layer is constituted by including a thermosetting resin and a thermoplastic resin.

9. The dicing die-bonding film according to claim 8, wherein the thermoplastic resin is an acrylic resin.

10. The dicing die-bonding film according to claim 8, wherein the thermosetting resin is at least any one of an epoxy resin or a phenol resin.

11. The dicing die-bonding film according to claim 1, wherein a cross-linking agent is added into the die bond layer.

* * * * *

UNITED STATES PATENT AND TRADEMARK OFFICE
CERTIFICATE OF CORRECTION

| | | |
|---|---|---|
| PATENT NO. | : 7,998,552 B2 | Page 1 of 1 |
| APPLICATION NO. | : 12/529070 | |
| DATED | : August 16, 2011 | |
| INVENTOR(S) | : Yasuhiro Amano, Sadahito Misumi and Takeshi Matsumura | |

It is certified that error appears in the above-identified patent and that said Letters Patent is hereby corrected as shown below:

Title page (item 54), Title, line 1, change "DIE BONDING" to --DIE-BONDING--.

Title page (item 73), Assignee, line 1, change "Nittok" to --Nitto--.

At Column 1 (Title), line 1, change "DIE BONDING" to --DIE-BONDING--.

At Column 1, line 2, Above "TECHNICAL FIELD" insert --This application is the U.S. National Phase under 35 U.S.C. §371 of International Application No. PCT/JP2008/051177, filed Jan. 28, 2008, which claims priority to the Japanese Patent Application No. 2007-051805, filed Mar. 1, 2007. The International Application was not published in English under PCT Article 21(2).--.

At Column 2, line 43, change "invention" to --invention.--.

At Column 3, line 36, After "that the" insert --die--.

At Column 10, line 21, change "phospinoxide;" to --phosphinoxide;--.

At Column 10, line 39, change "(20" to --(90--.

At Column 11, line 35, change "resin, polyimide" to --resin, polyamide--.

At Column 13, line 58, change "pentaoxide," to --pentoxide,--.

At Column 14, line 13, change "Polyethylenetelephthalate" to --Polyethyleneterephthalate--.

At Column 18, line 55, change "TOKOYAMA" to --TOKUYAMA--.

Signed and Sealed this
Tenth Day of April, 2012

David J. Kappos
*Director of the United States Patent and Trademark Office*